United States Patent
Beck et al.

(10) Patent No.: US 7,225,359 B2
(45) Date of Patent: May 29, 2007

(54) METHOD AND APPARATUS FOR MAPPING SIGNALS OF A DEVICE UNDER TEST TO LOGIC ANALYZER MEASUREMENT CHANNELS

(75) Inventors: Douglas James Beck, Colorado Springs, CO (US); William Michael Rainaldi, Colorado Springs, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 711 days.

(21) Appl. No.: 10/430,242

(22) Filed: May 5, 2003

(65) Prior Publication Data

US 2004/0225924 A1    Nov. 11, 2004

(51) Int. Cl.
*G06F 11/00* (2006.01)
(52) U.S. Cl. .............................. 714/30; 714/37; 714/39
(58) Field of Classification Search .................. 714/30, 714/37, 39
See application file for complete search history.

(56) References Cited

U.S. PATENT DOCUMENTS

| | | | |
|---|---|---|---|
| 6,396,517 B1 | 5/2002 | Beck et al. | |
| 6,407,736 B1 | 6/2002 | Sontag et al. | |
| 6,742,143 B2 * | 5/2004 | Kaler et al. | 714/39 |
| 6,760,866 B2 * | 7/2004 | Swoboda et al. | 714/34 |

OTHER PUBLICATIONS

Doug Beck, "Understanding Logic A nalyzer Triggering", Insight vol. 4, Issue 3 pp. 22-26, 1999.
U.S. Appl. No. 09/432,840.

* cited by examiner

*Primary Examiner*—Scott Baderman
*Assistant Examiner*—Tim Bonura
(74) *Attorney, Agent, or Firm*—June L. Bouscaren

(57) ABSTRACT

A method of mapping device pins to logic analyzer channels in preparation for a digital test includes accepting a correlation of at least one test connector to one or more logic analyzer pods and presenting a display showing available test connector pins for each defined test connector. A user may then select a one to one assignment of one or more signal pins to the test connector pins to establish a mapping configuration.

19 Claims, 9 Drawing Sheets

38-pin Mictor® connector pin assignment

| | Even probe Pin # | | | | Odd probe Pin # | |
|---|---|---|---|---|---|---|
| | +5VDC | 1 | | 2 | SCL | |
| | GND DC | 3 | | 4 | SDA | |
| | CLKe | 5 | | 6 | CLKo | |
| | D15e | 7 | | 8 | D15o | |
| | D14e | 9 | | 10 | D14o | |
| | D13e | 11 | | 12 | D13o | |
| | D12e | 13 | | 14 | D12o | |
| | D11e | 15 | | 16 | D11o | |
| | D10e | 17 | | 18 | D10o | |
| 504 | D9e | 19 | | 20 | D9o | 504 |
| | D8e | 21 | | 22 | D8o | |
| | D7e | 23 | | 24 | D7o | |
| | D6e | 25 | | 26 | D6o | |
| | D5e | 27 | | 28 | D5o | |
| | D4e | 29 | | 30 | D4o | |
| | D3e | 31 | | 32 | D3o | |
| | D2e | 33 | | 34 | D2o | |
| | D1e | 35 | | 36 | D1o | |
| | D0e | 37 | | 38 | D0o | |

FIG. 8

METHOD AND APPARATUS FOR MAPPING SIGNALS OF A DEVICE UNDER TEST TO LOGIC ANALYZER MEASUREMENT CHANNELS

BACKGROUND

Logic analyzers are an important tool for digital design and debug, particularly for large and complex digital circuits. To use a logic analyzer, individual logic analyzer measurement channels are electrically connected to points of interest in a device under test ("DUT"). Connections to the logic analyzer are grouped into logic analyzer pods. Conventionally, "flying leads" are used to make the connection between a logic analyzer and a DUT. A "flying lead" is part of a logic analyzer probe adapter system wherein a logic analyzer pod connector plugs into and makes connection to seventeen (17) logic analyzer measurement channels in the case of an Agilent logic analyzer. Seventeen individual wires extend from a ribbon cable attached to the pod connector, each wire in the ribbon cable having a spring-loaded clip for connecting to a single point on a DUT. As such, there is an immediate correlation between a signal on the DUT and a single logic analyzer measurement channel on a logic analyzer pod. As digital circuits increase in complexity and reduce in physical size, the "flying lead" probe adapter becomes more cumbersome and impractical to use. Some printed circuit board technologies use surface mount components, which do not provide a point to which a flying lead may be secured.

A known alternative to the "flying lead" probe adapter, is a connector pin probe adapter. Instead of the flying lead, the logic analyzer probe is connected to an electrical connector for plug compatibility with a mating electrical connector on the DUT. The connector pin probe adapter comprises a logic analyzer pod connector that plugs into the logic analyzer measurement channels and a ribbon cable with an individual wire for each of the measurement channels. The ribbon cable is then attached to a probe that comprises a multiple pin electrical connector. The probe is designed to connect to a mating connector on the DUT. This design obviates the presence of the individual loose wires and "flying lead" termination and also provides a solution to the problem of how to connect to a printed circuit board using surface mount components. The physical connection to the DUT is easy, secure and compact, but the direct and obvious correlation between the logic analyzer measurement channels and a single DUT signal is lost. A user, therefore, must use published mapping information for the probe adapter to correlate each DUT signal to a respective logic analyzer measurement channel.

The mapping process requires the user to identify the signal on the DUT and correlate the signal to a connector pin. This process is performed using the DUT schematic. The user must then reference probe adapter documentation to correlate the connector pin to the logic analyzer measurement channel and enter that information into the logic analyzer. The probe adapter documentation is available as part of the logic analyzer equipment. As one of ordinary skill in the art appreciates, correlation of information contained in separate documents leaves much room for human error. Additionally, the mapping process for large designs with multiple connectors is a tedious and time-consuming process. Identification and correction of mapping errors is also a time-consuming and tedious process and is detrimental to the job of setting up and testing a digital circuit.

There is a need, therefore, for an improved method of mapping logic analyzer measurement channels to DUT signals to reduce the time to set up and test a device with a logic analyzer and to reduce the potential for errors.

SUMMARY

A method of mapping device pins to logic analyzer measurement channels comprises the steps of accepting a correlation of at least one test connector to one or more logic analyzer pods, the one or more logic analyzer pods comprising one or more of the logic analyzer measurement channels and presenting a display showing available test connector pins for each defined test connector. The method continues with accepting a one to one assignment of one or more signal pins to the available test connector pins to establish a mapping configuration.

In another aspect of a method according to the teachings of the present invention, a method of mapping signals of a device under test to logic analyzer measurement channels comprises the steps of defining a type of test connector on the device under test that is electrically connected to the signals, defining a logic analyzer pod for connection to the test connector, the test connector establishing test connector pins, and assigning the signal pins to respective ones of the test connector pins.

In yet another aspect of a method according to the teachings of the present invention a method of testing using a logic analyzer comprises the steps of accepting a definition of a test connector on a device under test, accepting a logic analyzer pod assignment for the test connector, and establishing cross references between pins of the test connector and logic analyzer measurement channels of the assigned logic analyzer pod. The method continues with the steps of displaying the established cross reference, accepting signal assignments for test connector pins on the test connector, converting the signal pins to logic analyzer measurement channel assignments, measuring signals on the logic analyzer measurement channels, and displaying the measured signals according to the signal assignments.

BRIEF DESCRIPTION OF THE DRAWINGS

FIG. 8 is a diagram of mapping information between test connector pins and respective logic analyzer measurement channels.

DETAILED DESCRIPTION

Figure 1:
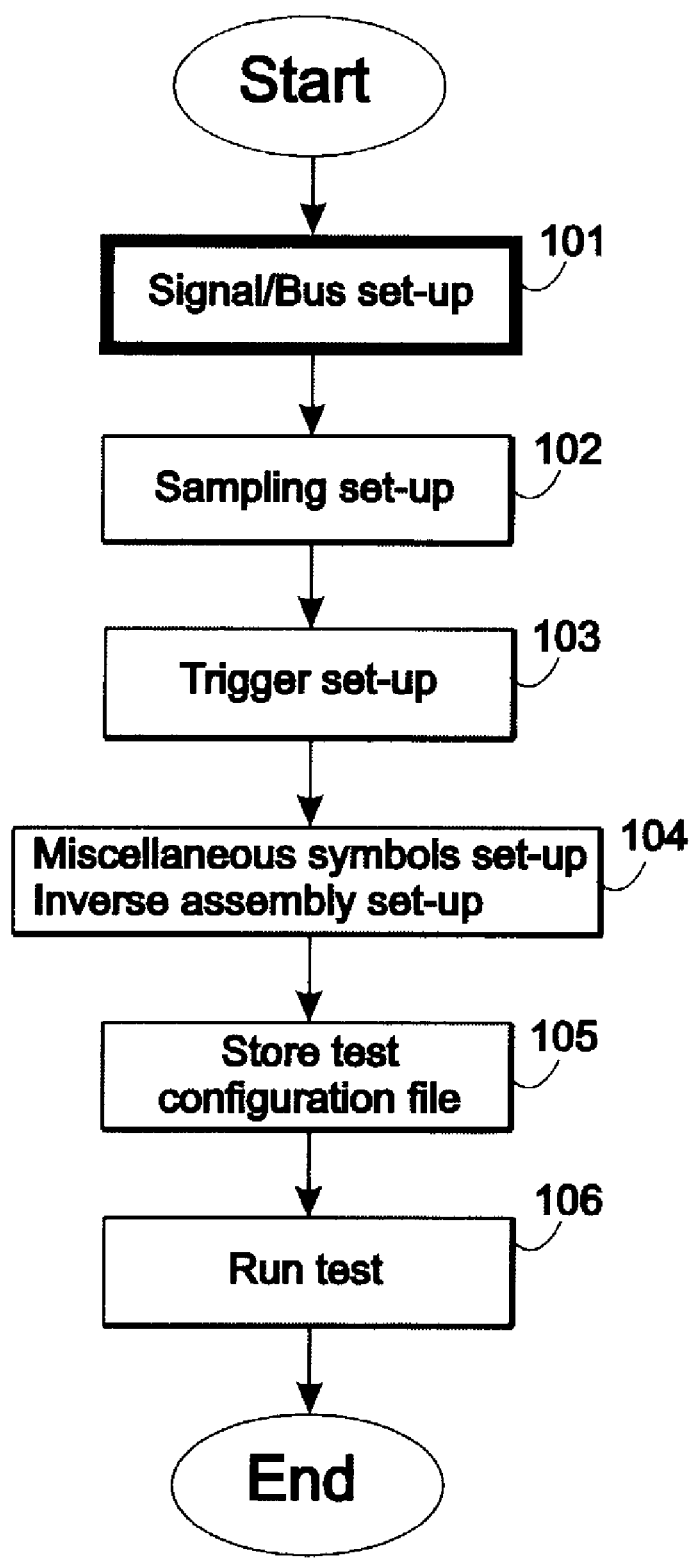
FIG. 1 is a flow chart of a logic analyzer test process.

With specific reference to FIG. 1 of the drawings, there is shown a flow chart of a logic analyzer test process to illustrate a context for a method according to the teachings of the present invention. A device under test ("DUT") has associated with it, a plurality of individual signals and perhaps one or more signal buses. Throughout this description, a "bus" refers to a grouping of "signals". Accordingly, reference is made to "signal/bus" to clarify that the description applies to both a signal and a bus that represents a grouping of signals. The electrical activity and timing of each signal/bus relative to each other is of interest in a digital test. In the test method, a first step is a signal/bus set-up 101. The set-up step 101 assigns signals of a DUT to logic analyzer measurement channels, so that an output of the test is displayed in terms of DUT signals instead of logic analyzer measurement channels. A moderate to complex DUT may have 40 signals/buses that require assignment, while a complex test may have hundreds of signals/buses. The accuracy of the set-up step is important to the overall effectiveness of the digital test.

A next step of the method is a sampling set-up 102 where the sampling parameters such as sampling frequency, sampling mode (either state or timing), and memory depth are established. Additional disclosure with respect to sampling is found in U.S. Pat. No. 6,407,756, the contents of which are hereby incorporated by reference. A user may then define a trigger set-up 103 to establish a signal/bus and logic level, range of logic values, or a trigger algorithm on which to trigger recordation. Other triggering constructs are also known in the art as shown in "Proven Methods Create Logic-Analyzer Triggers That Work" by Douglas Beck, Electronic Design, Oct. 28, 1999 issue (Vol 47 No. 22) pages 86–96. Parallel cite to "Understanding Logic Analyzer Triggering" by Doug Beck, Insight 1999 (Vol. 4, Issue 3).

A next step of the method illustrated in FIG. 1 of the drawings is the miscellaneous set-up 104 comprising the establishment of remaining miscellaneous parameters such as symbol set-up and logic command definitions for purposes of inverse assembly of captured data. When all of the set-up steps are complete, a user may choose to either run a test 106 or may store 105 the set-up parameters in a test configuration file for later use. In a specific embodiment, the storage format may be either binary or XML.

Figure 2:
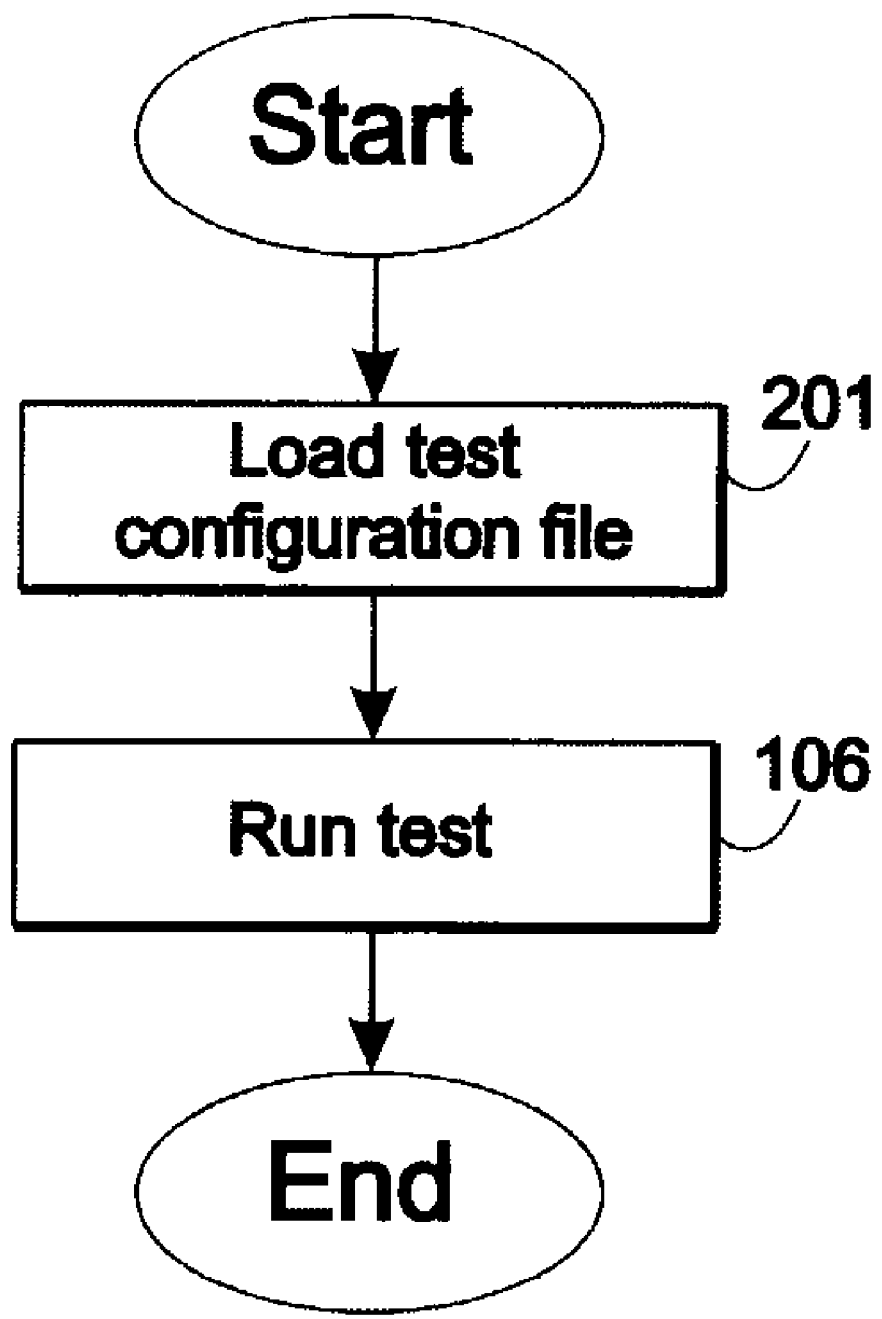
FIG. 2 is a flow chart of an optional embodiment of a logic analyzer test process.

With specific reference to FIG. 2 of the drawings, there is shown a flow chart illustrating retrieval and loading 201 of the test configuration file prior to running a test with the logic analyzer. The ability to retrieve a stored test configuration file advantageously permits establishing test parameters without tying up logic analyzer resources. For example, a software program presenting a graphical user interface ("GUI") that runs on a stand-alone computer can accept the test parameter input from the user and store a test configuration file in a format that the logic analyzer is able to readily retrieve. Test set-up may be performed on a desktop computer without logic analyzer involvement. In this way, the specialized logic analyzer resources may be used for testing other DUTs while another test is configured.

Figure 3:
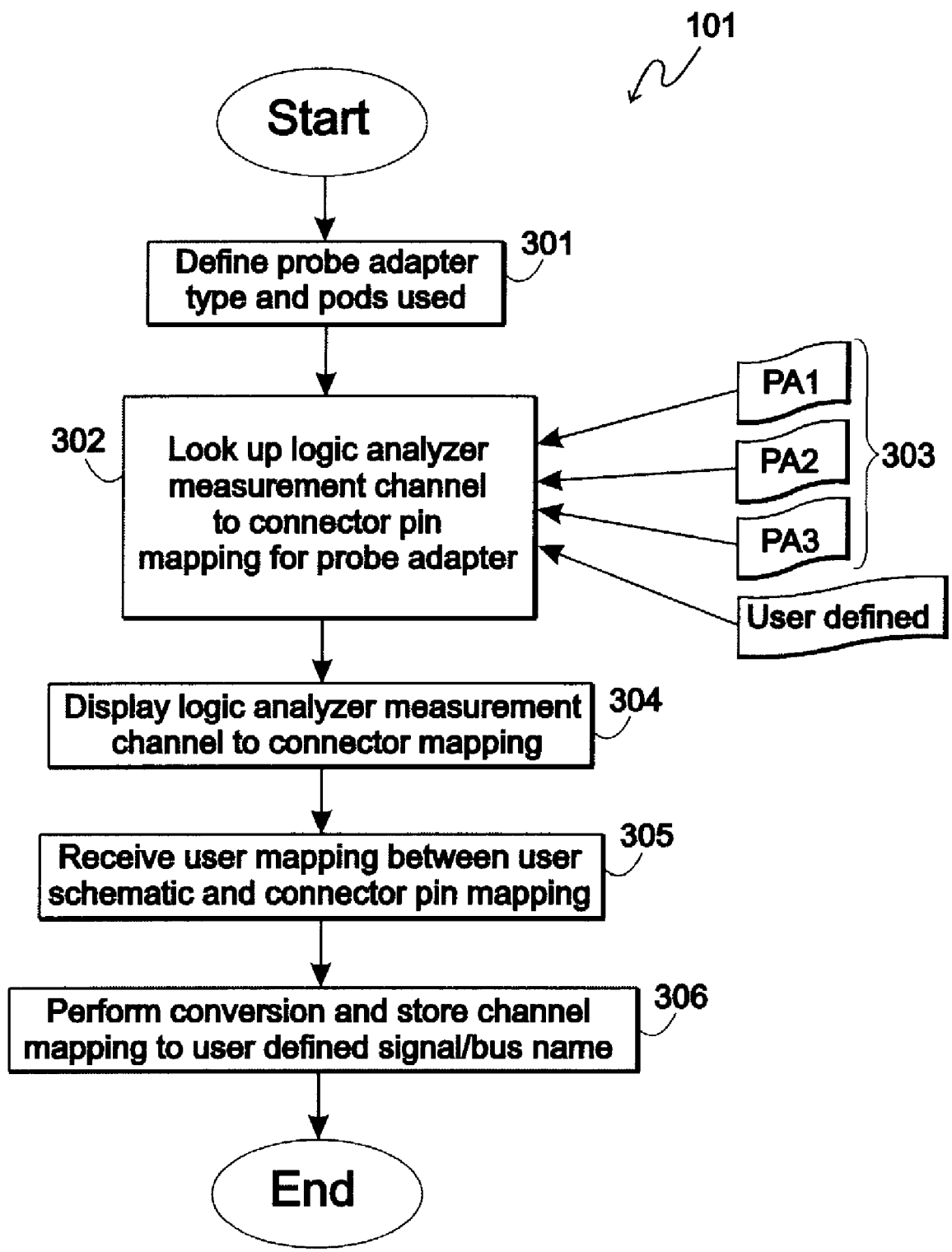
FIG. 3 is a flow chart detailing steps in a method according to the teachings of the present invention.
Figure 4:
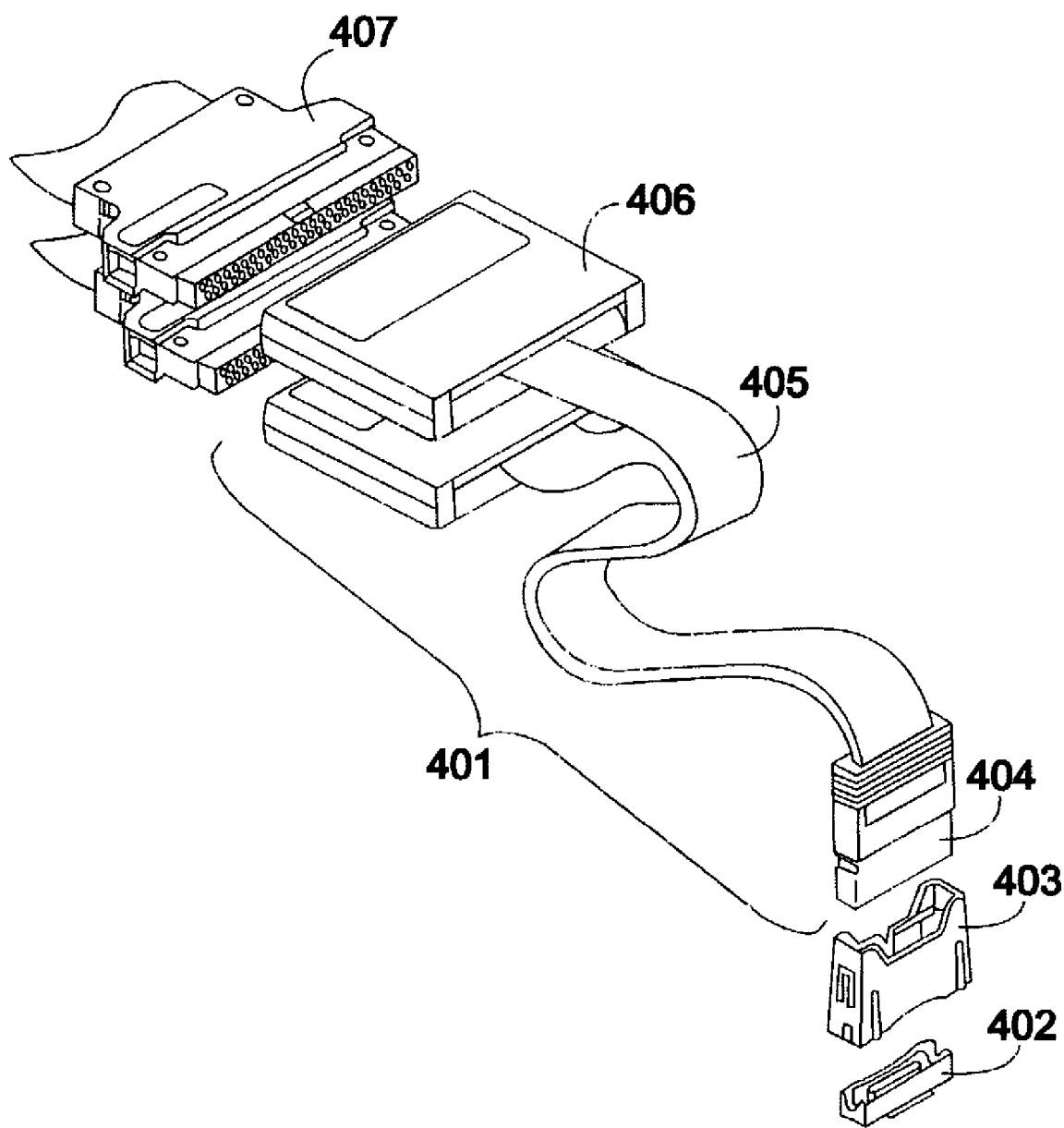
FIG. 4 is a perspective view of an illustrative probe adapter.

With specific reference to FIG. 3 of the drawings, there is shown a flow chart detailing the signal/bus set-up step 101 in a method according to the teachings of the present invention. In the signal/bus set-up, a user defines 301 a type of probe adapter to be used in the digital test as well as the physical pod of the logic analyzer to which the probe adapter is to be connected. As one of ordinary skill in the art appreciates, it is typical that a plurality of probe adapters is used to fully configure a logic analyzer for test. An illustrative probe adapter 401 is shown in FIG. 4 of the drawings. The probe adapter 401 is shown in conjunction with the logic analyzer pod 407 and the test connector 402 between which the probe adapter 401 is interposed. Conventionally, one or more test connectors 402 are mounted on a DUT. In this case, the DUT is typically a printed circuit board. Pins of the test connector 402 are electrically connected using conventional printed circuit board wiring to signals that are of interest in a digital test of the DUT. The pins of the test connector 402, therefore, provide the electrical access to the signals of interest in a test of the DUT. The probe adapter 401 comprises a number of different component parts as will be described. A probe 404 mates to the test connector 402. A shroud 403 may be placed between the probe 404 and the test connector 402 for improved mechanical stability of the connection between the test connector 402 and the probe 404. The probe 404 is attached to discrete wires of a ribbon cable 405, which, in turn, are connected to a logic analyzer connector pod 406. The logic analyzer connector pod 406 mates to the logic analyzer pod 407 of the logic analyzer. In this way, there is a one to one electrical correspondence between signals of the DUT and discrete logic analyzer measurement channels. Accordingly, the probe adapter 401 comprises the combination of elements 404, 405, and 406. Logic analyzer pod 407 is part of the logic analyzer equipment and test connector 402 is part of the DUT. The shroud 403 is a part whose use is recommended, but is not crucial to the establishment of the one to one correspondence between the DUT signals and the logic analyzer measurement channels. The probe adapter 401 shown in FIG. 4 of the drawings, shows a single test connector 402 having thirty-five (35) connector pins. Accordingly, the probe adapter 401 connects two logic analyzer pods 407 having seventeen (17) measurement channels each through a thirty-five (35) pin probe 404 for mating with the test connector 402.

Figure 5:
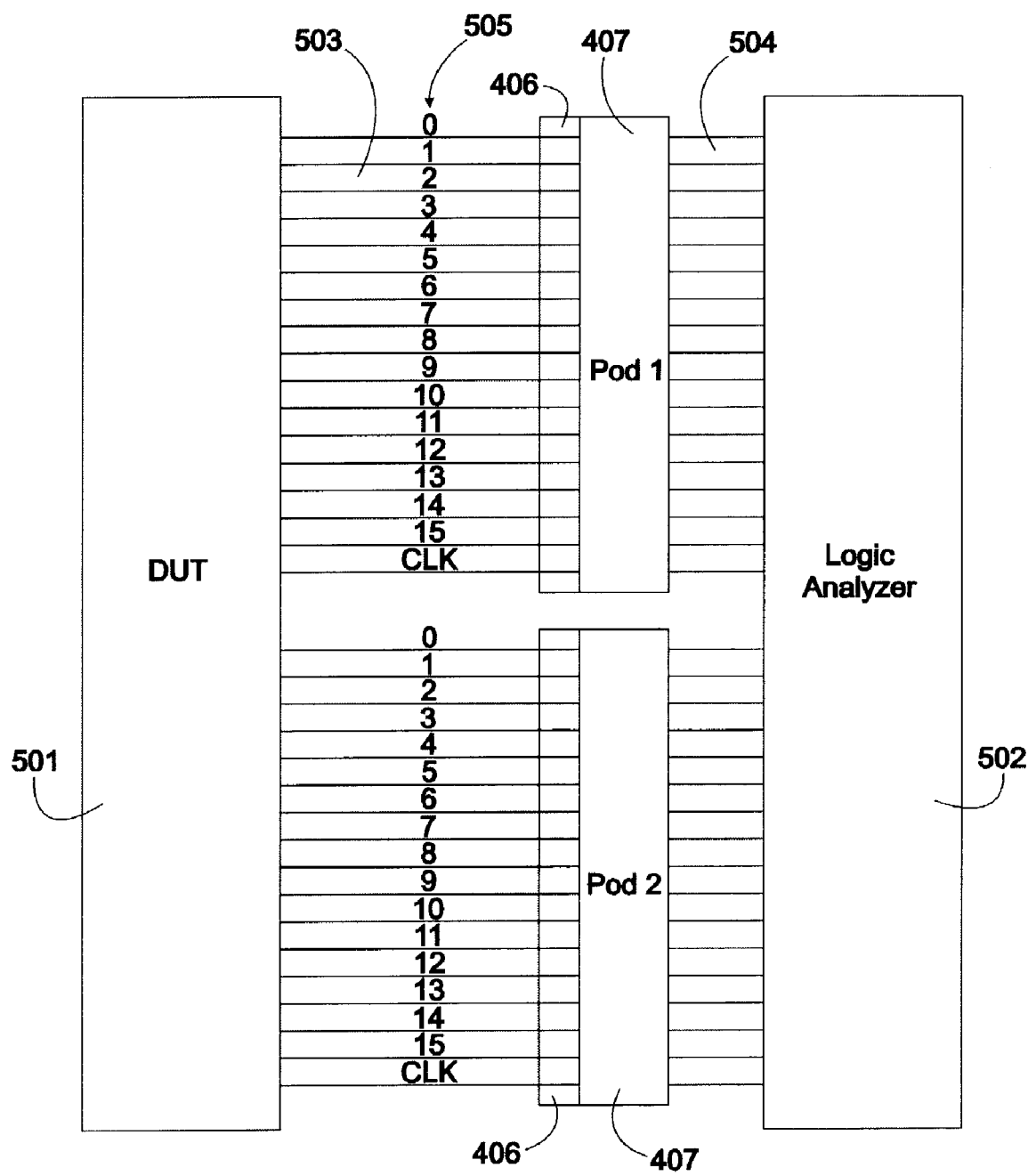
FIG. 5 is a diagram of a one to one correspondence between the test connector pins and the logic analyzer measurement channels.

With specific reference to FIG. 5 of the drawings, there is shown a representative diagram of the connections that are made between a DUT 501 and a logic analyzer 502. Signals of interest on the DUT 501 are electrically connected to test connector pins 503 on the test connector 402 (not shown as a physical part). A pin number 505 that is unique with respect to the test connector 501 represents each test connector pin 503. The test connector pins 503 are connected through the probe adapter 401 to the logic analyzer pods 407 to the logic analyzer measurement channels 504.

In a method according to the teachings of the present invention, when the type of probe adapter is defined, the user further defines the logic analyzer pod 407 to which the probe adapter 401 is connected. As in the illustrated example, the probe adapter 401 may have more than one pod connector 406. In that case, each pod connector 406 is assigned a pod 407 on the logic analyzer 502 for connection thereto. Given a previously defined probe adapter type, this information permits the logic analyzer to display measurement channel information in terms of test connector pin numbers.

Figure 6:
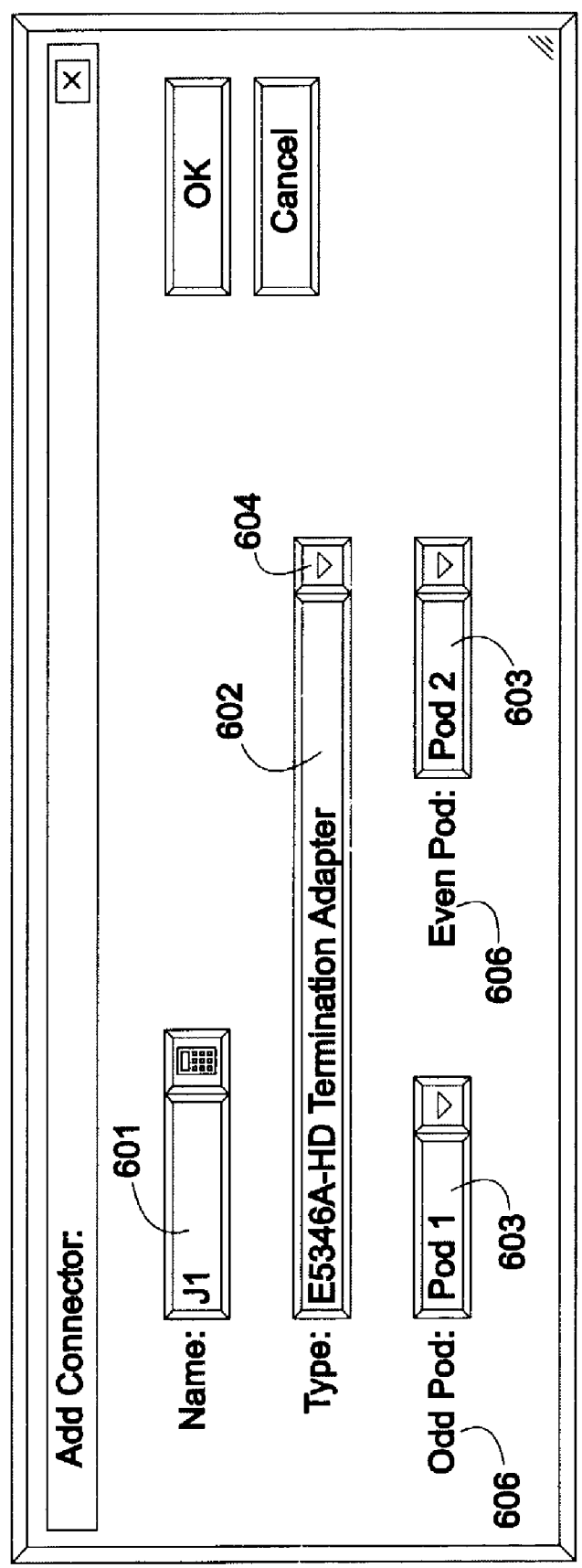
FIG. 6 is an illustration of a portion of a graphical user interface according to the teachings of the present invention.

With specific reference to FIG. 6 of the drawings, there is shown a GUI incorporated in an illustrated embodiment of a method according to the teachings of the present invention in which the GUI prompts a user for a test connector name 601, a probe adapter type 602, and a logic analyzer pod or pods selection 603 to which the probe adapter 401 is physically connected. The test connector name 601 establishes a unique name for a test connector on a DUT, so that each test connector may be individually defined even though they are the same type of connector. Advantageously, a display of the results may be in terms already known and established by a user in the digital circuit under test. For the given test connector name 601, the user selects a probe adapter type 602. The user makes a selection of a probe adapter type 602 based upon a conventional pull-down list 604 with one or more available selections of known probe adapter types. One of the selections may be a custom probe adapter that may be defined by the user. The probe adapter type 602 selection permits a user to define specific hardware that is to be interposed between the DUT and the logic analyzer pods 407. Given a probe adapter type 602, there is defined one or more variable pod names 606. In the illustrated embodiment, the variable pod names 606 are "odd pod" and "even pod". Each variable pod name 606 is displayed on the GUI and the user is asked to select a logic analyzer pod 407 for assignment to each variable pod 606. This selection informs the test configuration that a specific logic analyzer pod 407 is physically connected to a specific one of the pod connectors as defined for the probe adapter type 602. As one of ordinary skill in the art can appreciate, if the probe adapter type 602 defined included only a single pod connector 406, the GUI makes only one variable pod name 606 available to the user for selection. Similarly, if the probe adapter type 602 defined included three pod connectors 406, the GUI makes three variable pod names 606 available to the user for selection.

Figure 7:
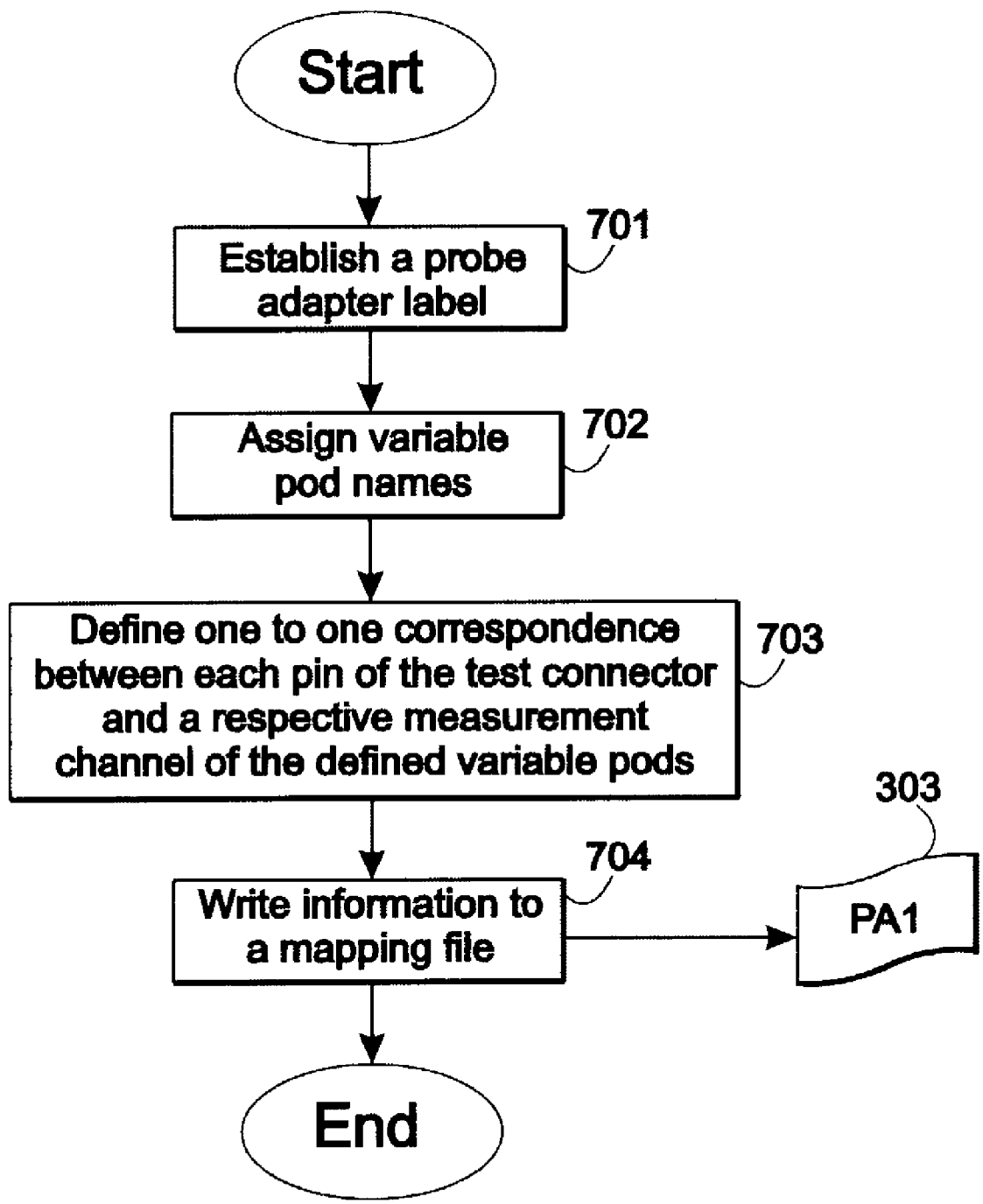
FIG. 7 is a flow chart of an embodiment of a feature according to the teachings of the present invention.

Some probe adapter type selections are already defined by a logic analyzer manufacturer and are available as a standard feature of the logic analyzer product. A process according to the teachings of the present invention permits definition of a new, custom or otherwise undefined probe adapter for use in the GUT illustrated in FIG. 6 of the drawings. With specific reference to FIG. 7 of the drawings, a process to define a custom probe adapter includes the steps of establishing 701 a probe adapter label. This label is used in the GUI of FIG. 6 as one of the selections for the probe adapter type 602 that is available using the standard pull-down menu 604. Next, each pod connector 406 of the custom probe adapter is assigned 702 one or more labels for the variable pod names 606. In the illustrated embodiment shown in FIG. 6, a probe adapter 401 that includes two pod connectors 406 has "even" and "odd" as the variable pod names 606. In a probe adapter including three pod connectors, the variable pod names could be "primary", "secondary" and "tertiary" or "A", "B" and "C" or any other name that assists the user in properly identifying the correct pod connector 406. The variable pod names 606 establish a unique pod connector 406 that is part of the probe adapter 401. It is also helpful if the variable pod names are silk screened or otherwise labeled on an outside housing of the pod connectors 406 on the probe adapter 401. Next in the custom probe adapter definition process; a one to one correspondence is established between each pin 503 of the test connector 402 and each measurement channel 504 of each variable pod. With specific reference to FIG. 8 of the drawings, there is shown a specific example of a mapping for a 38-pin Mictor® test connector 402. Because the Mictor® test connector has thirty-eight (38) connector pins 503, two logic analyzer pods 407 are used to connect to thirty-eight (38) logic analyzer measurement channels 504. In the example, the probe adapter type is given as "Mictor® 38-pin" and the variable pod names 606 given are "even probe" and "odd probe". The mapping file that corresponds to the Mictor® connector probe adapter 401 comprises a simple relational database structure to establish a one to one correspondence between the logic analyzer measurement channels 504 and the Mictor® connector pins 503.

In the example, the one to one correspondence is established between each pin 503 of the test connector 402 and respective measurement channels 504 associated with the variable pods 606. The probe adapter label (from step 701), the variable pod names (from step 702) and the mapping information (from step 703) is written and stored 704 as a binary or XML mapping file. The GUI shown in FIG. 6 of the drawings uses one or more of the mapping files to present guided configuration of the signal/bus set-up 101.

In another embodiment of a method according to the teachings of the present invention, due to the limited supply of different probe adapter types, it is more efficient to hardcode the mapping information for known probe adapters into the software that implements the GUI of FIG. 6. In an alternative embodiment, the mapping information is stored in various mapping files whereby the software implementing an embodiment of the process illustrated in FIG. 6 of the drawings retrieves an appropriate file based upon selected probe adapter types. As additional types of probe adapters become available, an embodiment according to the teachings of the present invention that uses retrievable mapping files may be more efficient than the hard-coding alternative.

The pod 407 to probe adapter 401 correlation that is defined as shown for example in FIG. 6 of the drawings combined with the physical connection of appropriate pod connector 406 to logic analyzer pod 407, is sufficient to establish a one to one correspondence between logic analyzer measurement channels 504 and test connector pins 503. Because this correspondence is known, the system is able to retrieve mapping information and perform the cross references necessary to then present the logic analyzer definition GUI in terms of connector pins and not logic analyzer measurement channels without further user intervention. "Mapping information" refers to the specific one to one correspondence between a specific one of the logic analyzer measurement channels and a respective one of the test connector pins that is either hard coded or stored in respective mapping files.

Figure 9:
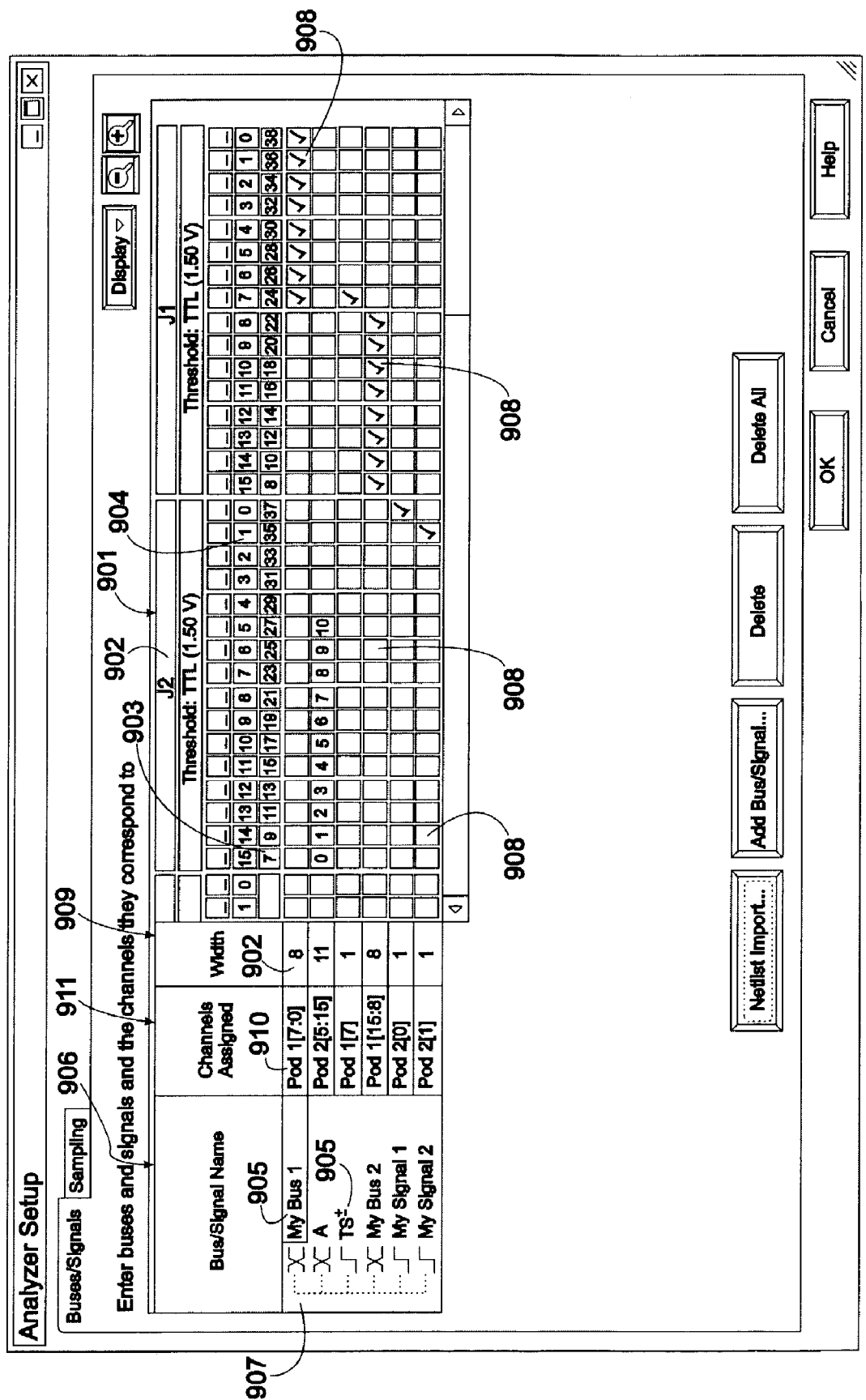
FIG. 9 is an illustration of a graphical user interface (GUI) used in a method according to the teachings of the present invention.

When the probe adapter assembly 401 and logic analyzer pods 407 are assigned, the system then presents 304 to a user, a tabular representation of the connector pins 503 available for further definition. With specific reference to FIG. 9 of the drawings, there is shown a GUI embodiment of a method according to the teachings of the present invention in which each pod 407 has a selection table 901 associated therewith. The selection table represents the test connector name 902, "J1" in the example and the test connector pin numbers 903 that are connected to logic analyzer measurement channels 504 and are, therefore, available for further definition. Optionally, the logic analyzer measurement channel numbers 904 and pod 910 may also be displayed for purposes of attaching flying leads. The user may then define any number of signal/bus textual labels 905 in the signal/bus name column 906. In a signal/bus row 907 corresponding to one of the signal/bus labels 905, the user may then "point & click" or "point, click & swipe" on cross correlation row-column points 908 to signify that one or more test connector pins 503 and, therefore, measurement channels 504 are referenced by the corresponding signal/bus label 905 in a digital test of the DUT. In an embodiment of a user interface, a right to left swipe presents the marked row-column points 908 in canonical order with the least significant bit on the right. A bus in canonical order is reflected with checks in the row-column points 908. A left to right swipe presents the marked row-column points 908 in non-canonical order. A bus in non-canonical order is reflected with numbers in the row-column points 908 where the numbers indicate the bit order significance of each marked bit. The GUI also provides the user with an opportunity to "point and click" as is conventional in the art on one or more row-column points to define which connector pin or pins in the respective column represent the signal or signal bus representation in the respective row. As is conventional, a "point and click" to an unassigned row-column operates to assign the corresponding test connector pin to the signal/bus defined in the row and a "point and click" to an assigned row-column point operates to remove the assignment of the test connector pin to the signal/bus defined in the row. As is also conventional, a user may "point, click, and swipe" to assign or remove an assignment of a number of connector pins relative to the signal pin and signal bus definitions. In essence, this process gives a signal or grouping of signals a unique name that is intuitively understood by the one running a test of the DUT. Advantageously, each name of the signal/bus may be made with reference only to the DUT schematic because the selection table 901 is in terms of test connector pins 503. De-selection of row-column points using the "point & click" process is made according to convention. Depending upon the number of measurement channels 504/test connector pins 503 that are selected, the system updates the width column 909 and pod and channels assigned 910 in the channels assigned column 911. Advantageously, a user refers to a DUT schematic to obtain direct test connector pin to signal/bus information. Therefore, the task of establishing a one to one correspondence between logic analyzer measurement channels and signals/busses of the DUT is more intuitive to a user and less prone to error.

When the user completes the step of defining the one to one signal to test connector pin correspondence in the selection table 901, the system receives the definitions for signal/bus labels as well as the test connector pin assignments and converts the signal/bus definitions into logic analyzer measurement channels 504. The converted information is then stored as part of the configuration file shown in step 105. A specific embodiment according to the teachings of the present invention is created using a Microsoft Windows Operating System with Microsoft Foundation Classes and C++ programming. In the embodiment, two lists are defined, a source list is the list of logic analyzer measurement channels 504 and a destination list is the list of related test connector pin numbers 503. The lists are stored as part of the test configuration file. Upon retrieving the test configuration file, the system calls a MapPodChannelTo-ConnectorPin subroutine whereby a Pod number and channel number are sent to the subroutine and the return parameter is a test connector pin number 503.

Although preferred embodiments of the invention are described herein, they are illustrative only. Other embodiments and modifications of the invention are possible and are covered by the spirit and scope of the appended claims. As an example, the method may be implemented with a GUI that takes a different look and form than the GUI shown as a representative example. In addition, it may be implemented in any number of computer operating systems using any tools available for database management and GUI development.

The invention claimed is:

1. A method of mapping device signals to logic analyzer measurement channels comprising the steps of:
   accepting a correlation of at least one test connector to one or more logic analyzer pods, said one or more logic analyzer pods comprising one or more of said logic analyzer measurement channels,
   presenting a display showing available test connector pins for each defined test connector, and
   accepting a one to one assignment of one or more of said device signals to said available test connector pins to establish a mapping configuration.

2. A method as recited in claim 1 and further comprising the step of repeating said step of accepting a correlation for each one in a plurality of said test connectors.

3. A method as recited in claim 1 and wherein said step of presenting a display presents assigned ones of said test connector pins and unassigned ones of said test connector pins in said mapping configuration.

4. A method of mapping as recited in claim 1 wherein said step of presenting displays a graphical user interface comprising a tabular display showing said test connector pins in columns of said tabular display and said signals in said rows of said tabular display.

5. A method as recited in claim 1 and further comprising the step of storing said mapping configuration as a data file.

6. A method as recited in claim 1 wherein said test connector is defined comprising the steps of establishing a probe adapter label, assigning variable pod names, and defining a one to one correspondence between pins of said test connector and respective measurement channels of said variable pod names.

7. A method of mapping signals of a device under test to logic analyzer measurement channels comprising the steps of:
   defining a test connector type for said device under test that is electrically connected to said signals,
   defining a logic analyzer pod for connection to said test connector type, said test connector establishing test connector pins, and
   assigning said signals to respective ones of said test connector pins.

8. A method of mapping as recited in claim 7 and further comprising the step of repeating the steps of defining, defining and assigning for each test connector on said DUT.

9. A method of mapping as recited in claim 7 wherein said step of assigning further comprises the step of presenting a graphical user interface and receiving a one to one assignment of said test connector pins to said signals.

10. A method of mapping as recited in claim 9 wherein said graphical user interface presents a tabular display showing said connector pins in columns of said tabular display and said signals in said rows of said tabular display.

11. A method as recited in claim 7 wherein said step of defining said test connector type further comprises the steps of establishing a probe adapter label, assigning variable pod names, and defining a one to one correspondence between pins of said test connector type and respective measurement channels of said variable pod names.

12. A method of testing using a logic analyzer comprising the steps of:
   accepting a definition of a test connector on a device under test,
   accepting a logic analyzer pod assignment for said test connector,
   establishing cross references between pins of said test connector and logic analyzer measurement channels of said assigned logic analyzer pod,
   displaying said established cross reference,
   accepting signal assignments for test connector pins on said test connector,
   converting said signal pins to logic analyzer measurement channel assignments, measuring signals on said logic analyzer channels, and displaying said measured signals according to said signal pin assignments.

13. A method as recited in claim 12 and further comprising the step of repeating the steps of accepting, establishing, displaying and converting for a plurality of test connectors on said device under test.

14. A method as recited in claim 13 and further comprising the step of storing said signal assignments for said test connector pins in a data file for retrieval prior to said step of measuring.

15. A method as recited in claim 12 wherein said step of accepting said signal assignments comprises accepting signal name assignments, presenting a table of said signal names versus said test connector pins, and establishing a relationship between one of said signal names and one or more of said test connector pins.

16. A method as recited in claim 12 wherein said step of establishing cross references further comprises the steps of selecting a logic analyzer probe adapter for connection to said logic analyzer pod and accessing a predefined cross reference for said selected logic analyzer probe adapter.

17. A method as recited in claim 16 wherein said predefined cross-reference is a data file.

18. A method as recited in claim 12 wherein said step of defining said test connector further comprises the steps of establishing a probe adapter label, assigning variable pod names, and defining a one to one correspondence between pins of said test connector and respective measurement channels of said variable pod names.

19. An apparatus for mapping device signals to logic analyzer measurement channels comprising the steps of:

means for accepting a correlation of at least one test connector to one or more logic analyzer pods, said one or more logic analyzer pods comprising one or more of said logic analyzer measurement channels, means for presenting a display showing available test connector pins for each defined test connector, and means for accepting a one to one assignment of one or more of said device signals to said available test connector pins to establish a mapping configuration.

* * * * *

UNITED STATES PATENT AND TRADEMARK OFFICE
CERTIFICATE OF CORRECTION

| | | |
|---|---|---|
| PATENT NO. | : 7,225,359 B2 | Page 1 of 1 |
| APPLICATION NO. | : 10/430242 | |
| DATED | : May 29, 2007 | |
| INVENTOR(S) | : Beck et al. | |

It is certified that error appears in the above-identified patent and that said Letters Patent is hereby corrected as shown below:

On the Title page, in field (56), under "U.S. Patent Documents", in column 2, line 1, delete "6,407,736" and insert -- 6,407,756 --, therefor.

On the Title page, in field (56), under "Other Publications", in column 2, line 1, delete "A nalyzer" and insert -- Analyzer --, therefor.

Signed and Sealed this

Eighteenth Day of September, 2007

JON W. DUDAS
*Director of the United States Patent and Trademark Office*